(12) United States Patent
Lee et al.

(10) Patent No.: US 7,099,420 B2
(45) Date of Patent: Aug. 29, 2006

(54) BLOCK INTERPOLATION FILTER STRUCTURE USING LOOKUP TABLE

(75) Inventors: Kyu-Ha Lee, Seoul (KR); Chung-Yong Lee, Seoul (KR)

(73) Assignee: Samsung Thales Co., Ltd., (KR)

( * ) Notice: Subject to any disclaimer, the term of this patent is extended or adjusted under 35 U.S.C. 154(b) by 821 days.

(21) Appl. No.: 10/227,041

(22) Filed: Aug. 23, 2002

(65) Prior Publication Data

US 2003/0067973 A1    Apr. 10, 2003

(30) Foreign Application Priority Data

Sep. 7, 2001    (KR) .................................. 2001-54978

(51) Int. Cl.
*H04B 1/10*    (2006.01)
(52) U.S. Cl. ...................... 375/350; 375/229; 708/313; 708/319
(58) Field of Classification Search ................ 375/229, 375/230, 232, 233, 234, 350, 296; 708/313, 708/319, 322, 323
See application file for complete search history.

(56) References Cited

U.S. PATENT DOCUMENTS

| | | | | |
|---|---|---|---|---|
| 5,778,029 A | * | 7/1998 | Kaufmann | .................. 375/296 |
| 5,838,725 A | * | 11/1998 | Gurusami et al. | .......... 375/229 |
| 5,870,431 A | * | 2/1999 | Easton et al. | ................ 375/230 |
| 6,202,074 B1 | * | 3/2001 | Lipka | .......................... 708/307 |
| 6,260,053 B1 | * | 7/2001 | Maulik et al. | ............... 708/313 |
| 6,427,158 B1 | * | 7/2002 | Wang et al. | ................ 708/313 |
| 6,820,103 B1 | * | 11/2004 | Butler et al. | ................ 708/319 |
| 6,888,904 B1 | * | 5/2005 | Lim et al. | .................... 375/350 |
| 6,907,024 B1 | * | 6/2005 | Regis | ......................... 370/342 |
| 2002/0118739 A1 | * | 8/2002 | Schier et al. | ............... 375/229 |

OTHER PUBLICATIONS

In Kang et al., "Multiple 1:N Interpolation FIR Filter Design Based on a Single Architecture", 1998 IEEE, pp. 316-319.
Jong-Kwan Choi et al., "Area-Efficient Pulse-Shaping 1:4 Interpolated FIR Filter Based on LUT Partitioning", Electronic Letters, Sep. 1999, vol. 35, No. 18, pp. 1504-1505.

* cited by examiner

*Primary Examiner*—Phuong Phu
(74) *Attorney, Agent, or Firm*—Dilworth & Barrese LLP (57) ABSTRACT

The present invention based on the LUT enables to perform a filtering at a low speed on a place where a high-speed process is necessary. Particularly, the LUT structure having a block structure is advantageous for filtering at a low speed, and for decreasing memory usage. The filter structure proposed by the present invention provides the equivalent performances to those of the traditional ones, yet conducts the filtering on an interpolation process requiring a high-speed process previously at a low speed and at a low power instead. Moreover, compared to the traditional LUT based filter, the present invention provides a new structure with a decreased memory demand. In short, the present invention provides a new filter structure that enables to implement an interpolation filter, a high-speed processor of a sending end in a wireless telecommunication system, with a low complexity and a low power consumption.

5 Claims, 8 Drawing Sheets

| h0+h4+<br>h8+h12+<br>h16+h20 | h1+h5+<br>h9+h13+<br>h17+h21 | h2+h6+<br>h10+h14+<br>h18+h22 | h3+h7+<br>h11+h15+<br>h19+h23 |
|---|---|---|---|
| h4+h8+<br>h12+h16+<br>h20 | h5+h9+<br>h13+h17+<br>h21 | h6+h10+<br>h14+h18<br>+h22 | h7+h11+<br>h15+h19+<br>h23 |
| h0+h8+<br>h12+h16+<br>h20 | h1+h9+<br>h13+h17+<br>h21 | h2+h10+<br>h14+h18<br>+h22 | h3+h11+<br>h15+h19+<br>h23 |
| h8+h12+<br>h16+h20 | h9+h13+<br>h17+h21 | h10+h14+<br>h18+h22 | h11+h15+<br>h19+h23 |
| ⋮ | ⋮ | ⋮ | ⋮ |
| h8 | h9 | h10 | h11 |
| h0+h4 | h1+h5 | h2+h6 | h3+h7 |
| h4 | h5 | h6 | h7 |
| h0 | h1 | h2 | h3 |

$G_0$

FIG.7

US 7,099,420 B2

BLOCK INTERPOLATION FILTER STRUCTURE USING LOOKUP TABLE

PRIORITY

This application claims priority to an application entitled "Block interpolation Filter Structure Using Lookup Table" filed in the Korean Industrial Property Office on Sep. 7, 2001 and assigned Ser. No. 2001-54978, the contents of which are hereby incorporated by reference.

BACKGROUND OF THE INVENTION

1. Field of the Invention

The present invention relates to interpolation filters. In particular, the present invention relates to an interpolation filter for use of sending end of a wireless telecommunication system.

2. Description of the Related Art

For the wireless telecommunication system like CDMA-2000 (Code Division Multiple Access-2000), W-CDMA (Wideband-Code Division Multiple Access), or SDR (Software Defined Radio), a low complexity and a low power are essential factors. It is no wonder that so much research on those are actively under development right now. Among others, a pulse-shaping interpolation filter for a sending end of such system decreases the interference between symbols, and provides an appropriate shape for the frequency region. In fact, the standard set for the mobile telecommunication system like IS-95 (Industry Standard-95), CDMA-2000, W-CDMA and so forth, particularly requires use of a FIR (far infra-red) filter for the pulse-shaping interpolation filter. Recently, after further research for developing the interpolation with a low speed and low calculation work and low power, a structure based on look up table (LUT) has been introduced.

A typically used FIR transversal filter as suggested by Hogenauer requires an excessive amount of multiplication and a high-speed filtering. That is why the LUT filter based on the ROM (read only memory), or a new filter structure with ½ smaller LUT size and memory demand using the symmetry of the filter coefficient was introduced. Such filters have the structure of polyphase decomposition. Especially the FIR filter includes polyphase subfilters corresponding to the interpolation rate, and each subfilter conducts a low-speed parallel filtering that is proportional to the parallel process and the interpolation rate. Unfortunately however, the LUT filter based on the ROM occupies 90% of the entire filter region when the filter is actually implemented, so the memory demand thereof is consequently very high.

SUMMARY OF THE INVENTION

It is, therefore, an object of the present invention to provide a block interpolation filter structure using a look up table (LUT), that is, a new LUT based filter using a block structure that enables a low-speed filtering and a decrease in memory demand in order to solve problems of a high-speed filtering clock observed in a traditional FIR traversal filter and of a high memory demand observed in a LUT based polyphase filter structure.

The LUT based present invention enables a low-speed filtering on which a high-speed process used to be required. Besides the LUT structure, the block structure also makes it possible to perform a low-speed filtering by a parallel process and to decrease the memory use. Particularly, the filter structure according the present invention is advantageous in that it provides equivalent performances, yet performing the filtering at a low speed and a low power for the interpolation process that was previously done at a very high speed consuming a lot of power. Accordingly, a primary goal of the present invention is to establish a new filter structure that enables implementation of an interpolation filter of a sending end in a wireless telecommunication system, which is a high-speed processor at a low complexity and a low power.

To achieve the above object, there is provided an N-tap block interpolation filter with M interpolation rates, including an N/M sized input buffer; N/M LUT subfilters having a same filter coefficient with the interpolation rate M for outputting a pre-saved filtering result by conducting an indexing on an input stream; M adders for vector addition of each filtering result; and M parallel-serial buffers for buffering the result from the M adders.

BRIEF DESCRIPTION OF THE DRAWINGS

The foregoing and other objects and features of the present invention will become more fully apparent from the following description and appended claims, taken in conjunction with the accompanying drawings. Understanding that these drawings depict only typical embodiments of the invention and are, therefore not to be considered limiting of its scope, the invention will be described with additional specificity and detail through use of the accompanying drawings in which:

DETAILED DESCRIPTION OF THE PREFERRED EMBODIMENT

A preferred embodiment of the present invention will now be described with reference to the accompanying drawings. In the following description, same drawing reference numerals are used for the same elements even in different drawings. The matters defined in the description focus on those that will assist in a comprehensive understanding of the invention. Thus, well-known functions or constructions are not described in detail since they would obscure the invention in unnecessary detail.

Figure 1A:
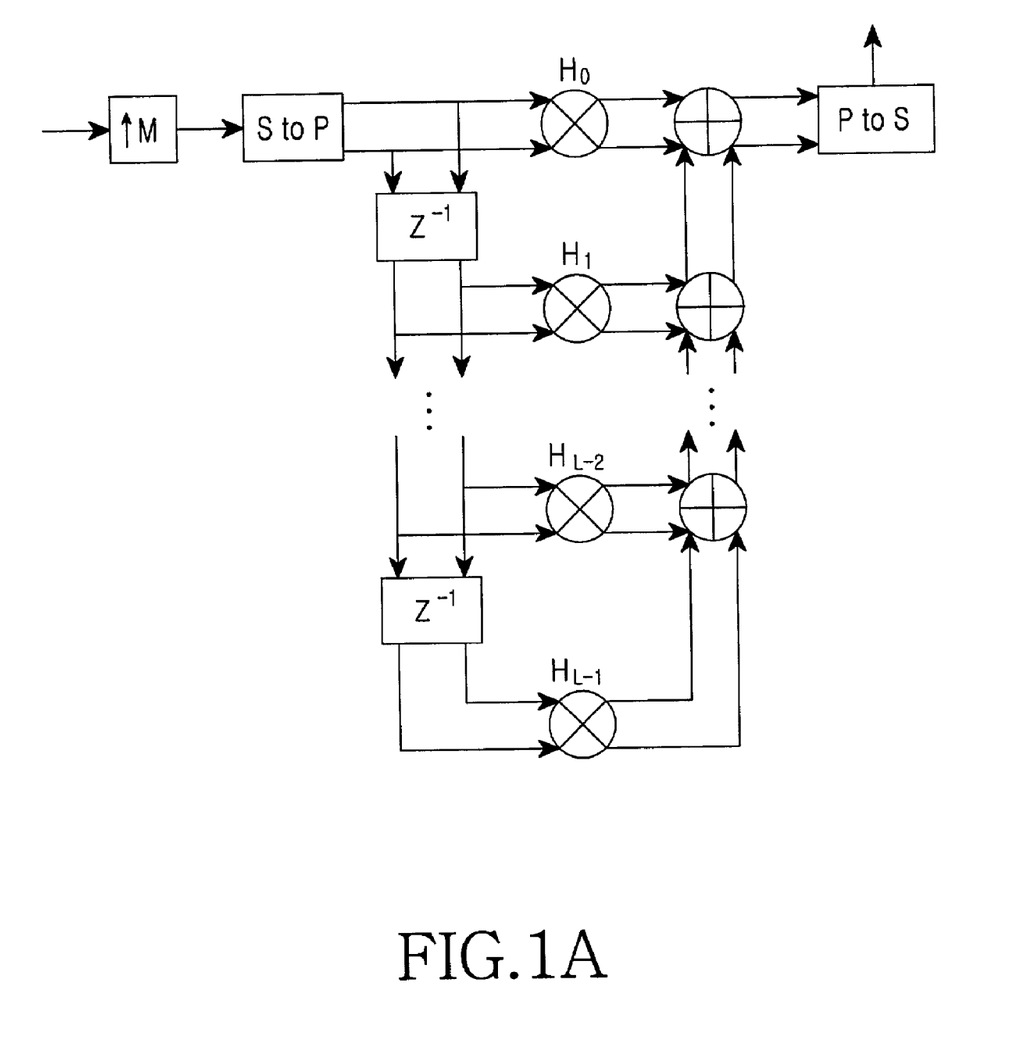
FIG. 1a diagrammatically shows a structure of a general block interpolation filter.
Figure 1B:
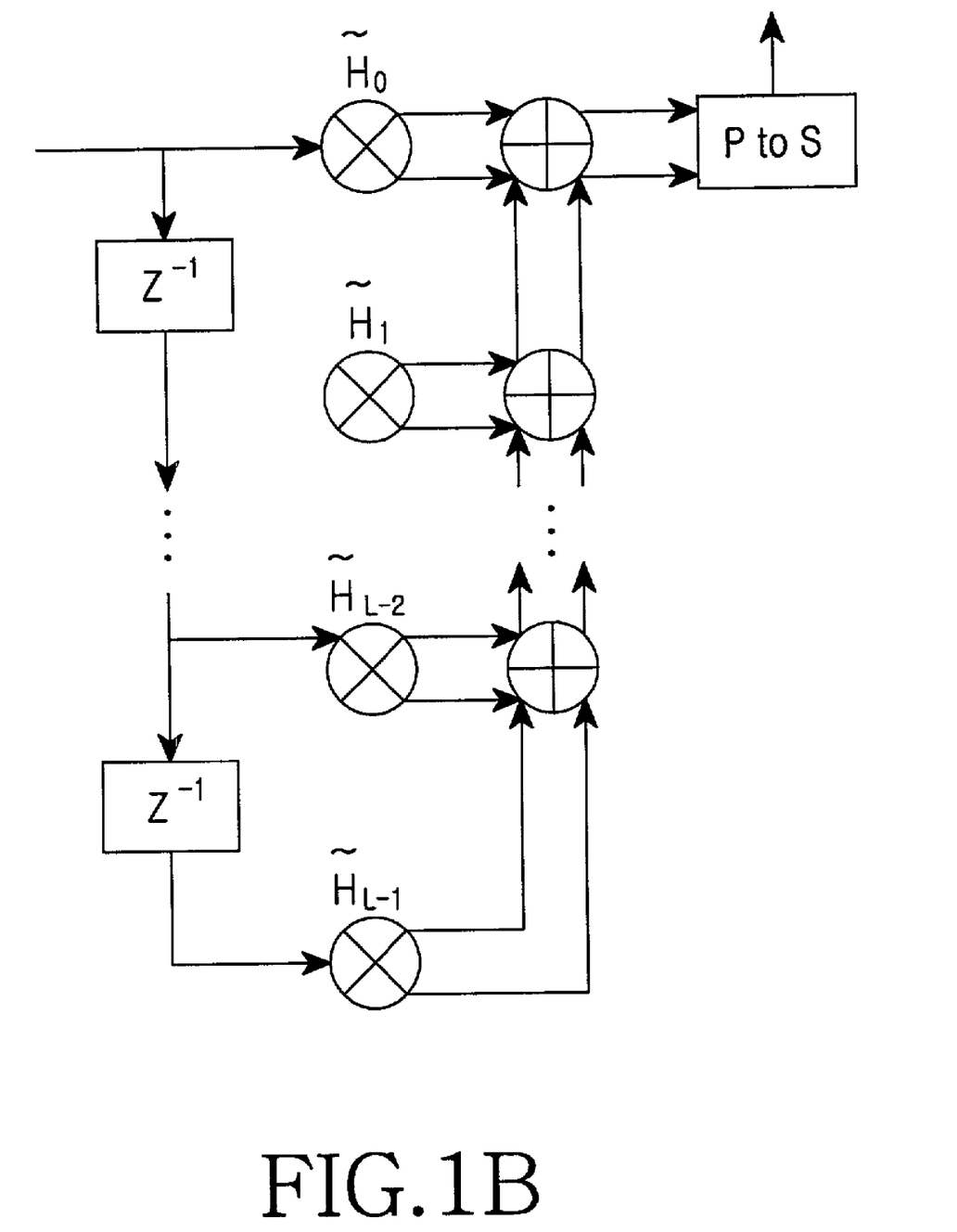
FIG. 1b diagrammatically shows an equivalent structure to the FIG. 1a without an up-sampler.

FIG. 1a illustrates a structure of a general block interpolation filter, and FIG. 1b illustrates an equivalent structure to the FIG. 1a without an up-sampler.

Particularly, in the interpolation filter having the interpolation rate 1:M (Finite impulse response), the relation between the input x(k) and the output y(k) can be expressed in the following formula.

$$y(k) = \sum_{i=0}^{\infty} h(k-i)u(i) = h(k) * u(k) \quad \text{Mathematical Formula 1}$$

$$u(k) = \begin{pmatrix} x(k') & \text{if } k = Mk' \\ 0 & \text{otherwise} \end{pmatrix}$$

Here, if the filter output, $y=[y_0, y_1 \ldots]^T$, is put on a matrix form, the formula 2 is derived $$y = Hx = \begin{bmatrix} h_0 & 0 & 0 & 0 & 0 \\ h_1 & h_0 & 0 & 0 & 0 \\ h_2 & h_1 & h_0 & 0 & 0 & \cdots \\ h_3 & h_2 & h_1 & h_0 & 0 \\ & & \vdots & & \end{bmatrix} \begin{bmatrix} x_0 \\ 0 \\ \vdots \\ x_1 \\ 0 \\ \vdots \end{bmatrix} \quad \text{Mathematical Formula 2}$$

The matrix H can be further divided into submatrices, such as, M×M submatrix. Also, the vector x and the vector y can be divided to M×1 subvectors. Therefore, the block interpolation filtering regarding the divided input/output into blocks can be represented by the following formula 3, a block of a submatrix and a vector.

$$\begin{bmatrix} y_0 \\ y_1 \\ y_2 \\ \vdots \end{bmatrix} = \begin{bmatrix} H_0 & 0 & 0 \\ H_1 & H_0 & 0 \\ H_2 & H_1 & H_0 & \cdots \\ & \vdots & \end{bmatrix} \begin{bmatrix} x_0 \\ x_1 \\ x_2 \\ \vdots \end{bmatrix} \quad \text{Mathematical Formula 3}$$

Here, $H_1$, $x_1$ and $y_1$, respectively, indicate:

$$H_l = \begin{bmatrix} h_{lM} & h_{lM-1} & \cdots & \cdots & h_{(l-1)M+1} \\ h_{lM+1} & h_{lM} & \cdots & \cdots & h_{(l-1)M+2} \\ \vdots & \vdots & \ddots & & \vdots \\ \vdots & \vdots & & \ddots & \vdots \\ h_{(l+1)M-1} & h_{(l+1)M-2} & \cdots & \cdots & h_{lM} \end{bmatrix}, \quad \text{Mathematical Formula 4}$$

$$x_l = [x_{lM} \; 0 \; \cdots \; 0]^T,$$

$$y_l = [y_{lM} \; y_{lM+1} \; \cdots \; y_{(l+1)M-1}]^T,$$

$$l = 0, 1, \ldots, L-1$$

The block interpolation filter structure based on $H_1$ and $x_1$ is depicted in FIG. 1a. Regarding FIG. 1a, ↑M means an up-sampling M times and outputs $[x_{lM} \; 0 \ldots 0]$ which 0 of M−1 number with respect to Input $x_{lM}$ is padded. A single arrow indicates an input and output of a single sample, a double arrow means an input and output of a unit of a vector. S-to-P means serial-to-parallel and vector conversion regarding single sample, P-to-S means parallel-to-serial. $Z^{-1}$ means 1 sample delay, a series of $Z^{-1}$ is input into a buffer memory such as shift register. L is the number of subfilters, and is obtained by the ratio N/M.

In the block $x_1$, since all the factors except for the first factor take the value of zero, the matrix $H_1$ and the vector $x_1$ can be substituted with what are defined in the formula 5, a vector $h_1$ and a scalar value $x_{lM}$.

$$\tilde{H}_l = \begin{bmatrix} h_{lM} & 0 & \cdots & \cdots & 0 \\ 0 & h_{lM+1} & 0 & \cdots & 0 \\ \vdots & \vdots & \ddots & & \vdots \\ \vdots & \vdots & & \ddots & 0 \\ 0 & & \cdots & \cdots & h_{(l+1)M-1} \end{bmatrix} \quad \text{Mathematical Formula 5}$$

$$\tilde{x}_l = [x_l \; x_l \; \cdots \; x_l]^T$$

wherein, the block input is converted into a sample $x_{lM}$, so it can be expressed as in FIG. 1b where no up-sampler is used. This is why the filtering of the interpolation filter does not speed up but maintains the input rate as it is. When a N-tap filter is used for 1:M interpolation, the filtering rate is M times of input rate. But, using a block structure, each subfiltering is performed at the low rate of N/M, so it enables low power consumption.

Figure 2:
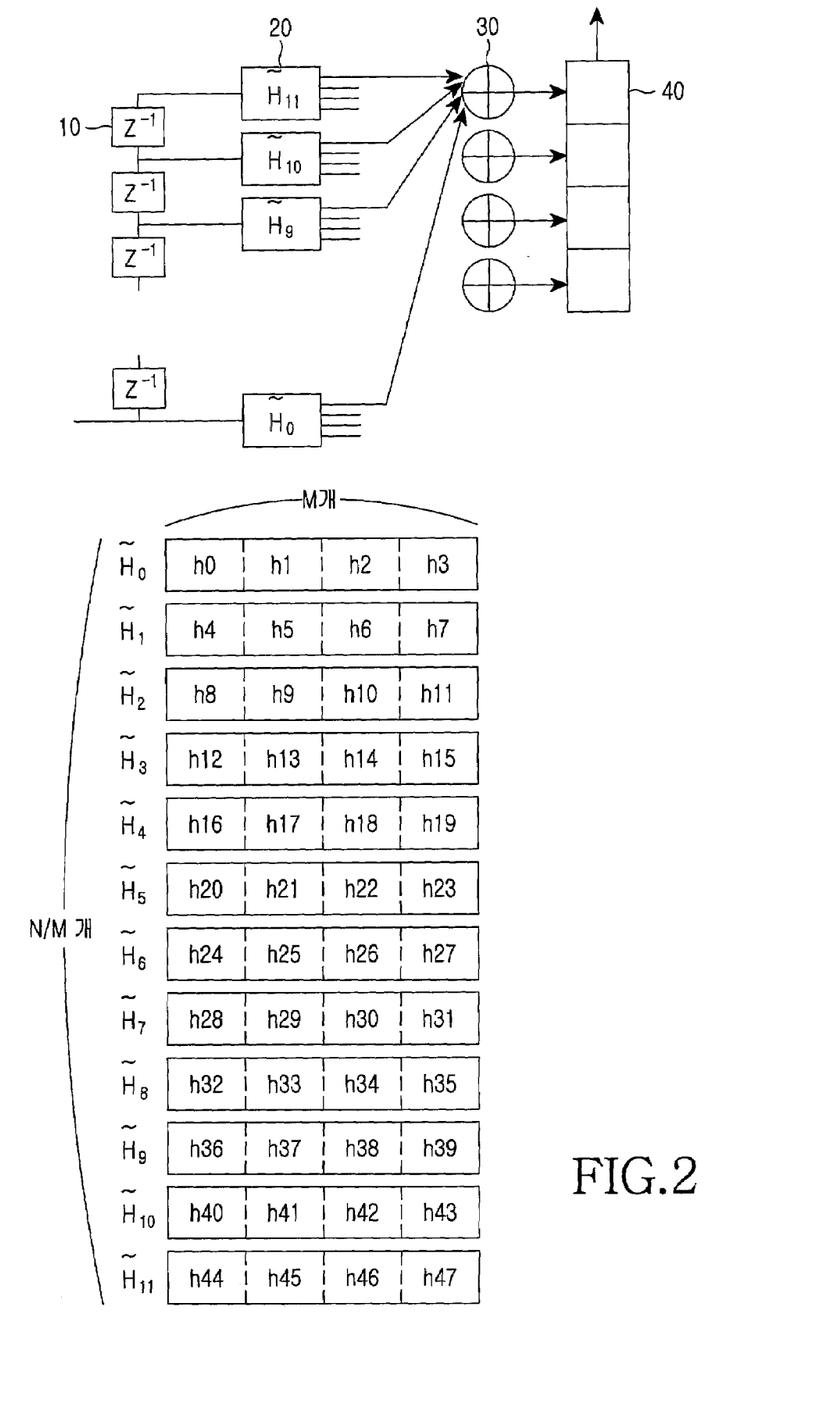
FIG. 2 diagrammatically shows a look up table (LUT) based block interpolation filter according to a first embodiment of the present invention.

(1) Filter's Direct Form Structure according to a First Embodiment of the Present Invention The present invention provides the structure of a block filter using the look up table (LUT). Specifically, FIG. 2 illustrates a LUT based block interpolation filter whose interpolation ratio is 1:4 (i.e., interpolation rate of 4) having a 48-tap filter in accordance with the first embodiment of the present invention. In the following, M indicates the interpolation rate and N indicates the number of filter tap.

The block filter depicted in FIG. 2 includes an N/M sized input buffer 10 regarding 1:M interpolation ratio where parallel data is inputted; a LUT 20 for filtering; an adder 30 for adding each filtering result; and a buffer 40 having a same size with a block size of an output, M. The inputting process is usually performed in parallel, but all the calculation after the filtering process is conducted in a vector form. Since an input signal is a binary bitstream, the output value of each subfilter(i.e., each LUT 20) is either zero (0) or non-zero (any value besides zero). Thus the size of the LUT of every subfilter is 2. And, each subfilter outputs M×1 vector for a sample input, and obtains the vector sum by adding each subfilter's result, and outputs the sum through a parallel-serial conversion buffer 40. In other words, the direct form structure of a suggested filter, given that the filter coefficient is N, performs the vector summation of the N/M sized input buffer, N/M subfilter LUT, and NW memory. Here, the size of the LUT indicates the number of entries, and W indicates the width of outputted data.

(2) Structure of Improved Filter using Coefficient Symmetry according to a Second Embodiment of the Present Invention The coefficient symmetry of a linear phase FIR filter can decrease the size of the LUT and the memory demand as much as one-half, by sharing the LUT. Table 1 below shows the symmetry of the filter coefficients of the block filter.

TABLE 1

| $\tilde{H}_0$ | $\tilde{H}_1$ | ... | $\tilde{H}_{L/2-2}$ | $\tilde{H}_{L/2-1}$ | |
|---|---|---|---|---|---|
| $h_0 \ldots h_{M-1}$ | $h_0 \ldots h_{2M-1}$ | ... | $h_{N/2-2M} \ldots h_{N/2-1}$ | $h_{N/2-M} \ldots h_{N/2-1}$ | |
| $\tilde{H}_{L-1}$ | $\tilde{H}_{L-2}$ | ... | $\tilde{H}_{L/2+1}$ | $\tilde{H}_{L/2}$ | |
| $h_{N-1} \ldots h_{N-M}$ | $h_{N-M-1} \ldots h_{N-2M}$ | ... | $h_{N/2+2M-1} \ldots h_{N/2+M}$ | $h_{N/2+M-1} \ldots h_{N/2}$ | |

Figure 3:
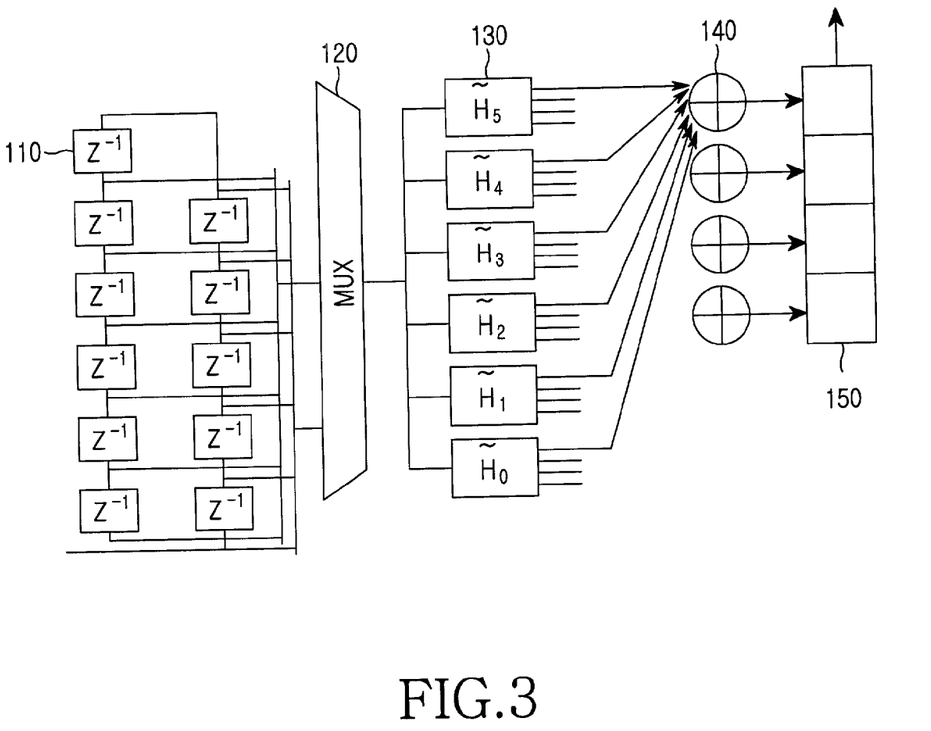
FIG. 3 diagrammatically shows a block interpolation filter using a common LUT according to a second embodiment of the present invention.

In N-tap filter, coefficients of subfilter $\tilde{H}_0$ pair off with $\tilde{H}_{L-1}$ having the equivalent value. The subfilters $\tilde{H}_1$ and $\tilde{H}_{L-2}, \ldots, \tilde{H}_{L/2-1}1$ and $\tilde{H}_{L/2}$ are equivalent. FIG. 3 shows the block interpolation filter the shared LUT in accordance with the second embodiment of the present invention. The filter structure illustrated in FIG. 3 includes an N/M sized input buffer 110, a 2×1 multiplexer 120, an N/2M sized LUT 130, an adder 140, and an output buffer 150. Because the inputting process is divided into 2 groups and is filtered off using the same LUT with a certain time interval, the memory space usage of the filter using the coefficient symmetry is decreased to NW/2, which is half of the memory space usage of the direct form of the first embodiment aforementioned. On the other hand, the filtering clock thereof is two times of that of the direct form because the inputting process is divided into 2 groups.

(3) Optimum Filter according to Generalization of Filter Structure

The filter structure of the present invention can be restructured as shown in FIGS. 4 through 7 by filtering on the basis of the binary input stream. In the meantime, the input width of the subfilter, m, and the frequency of the addition operation after the subfiltering by the LUT are determined by the number of groups of the subfilter.

Figure 4:
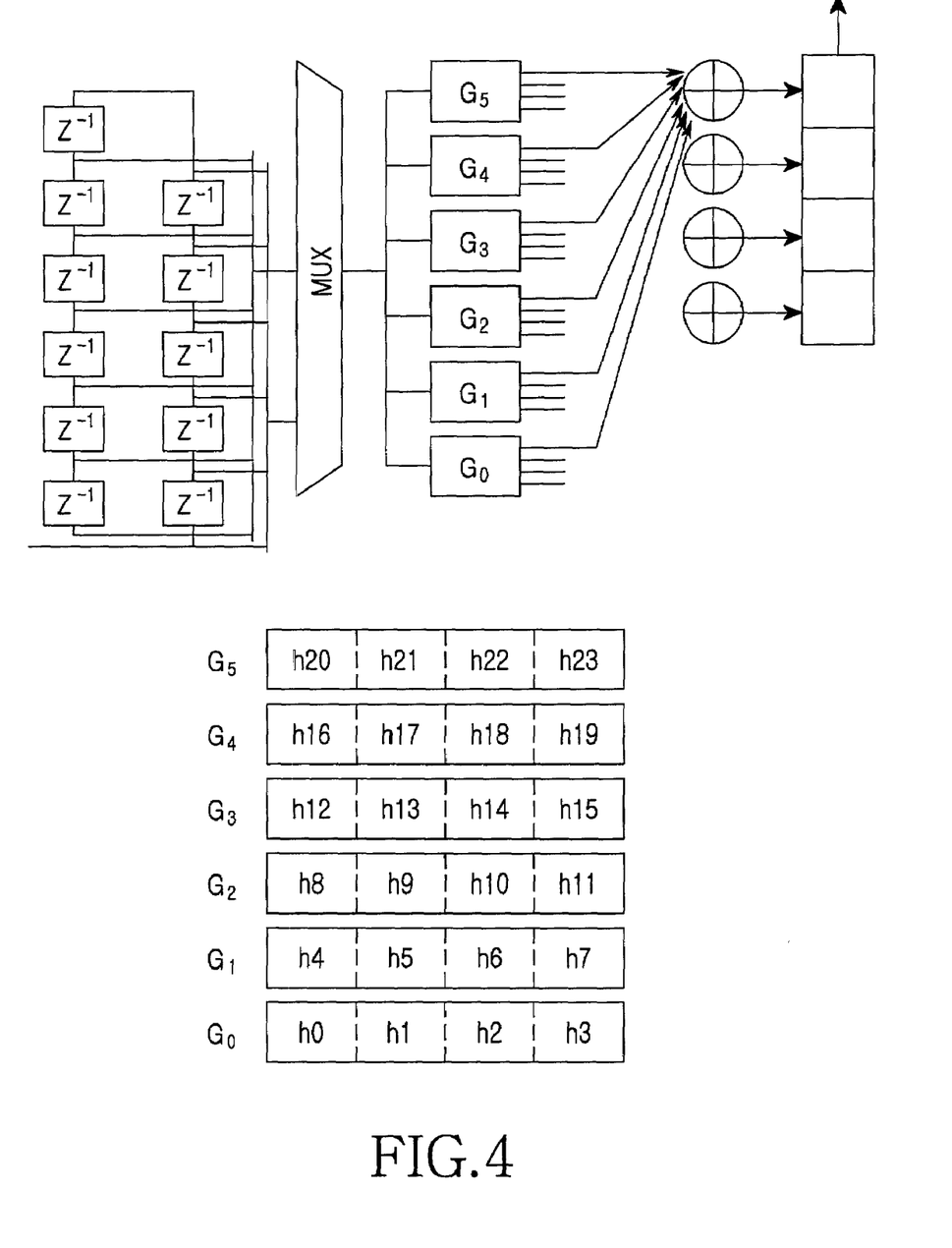
FIG. 4 diagrammatically shows a block interpolation filter in which an input of a subfilter, m, is 1, according to the interpolation filter structure of the present invention.
Figure 5:
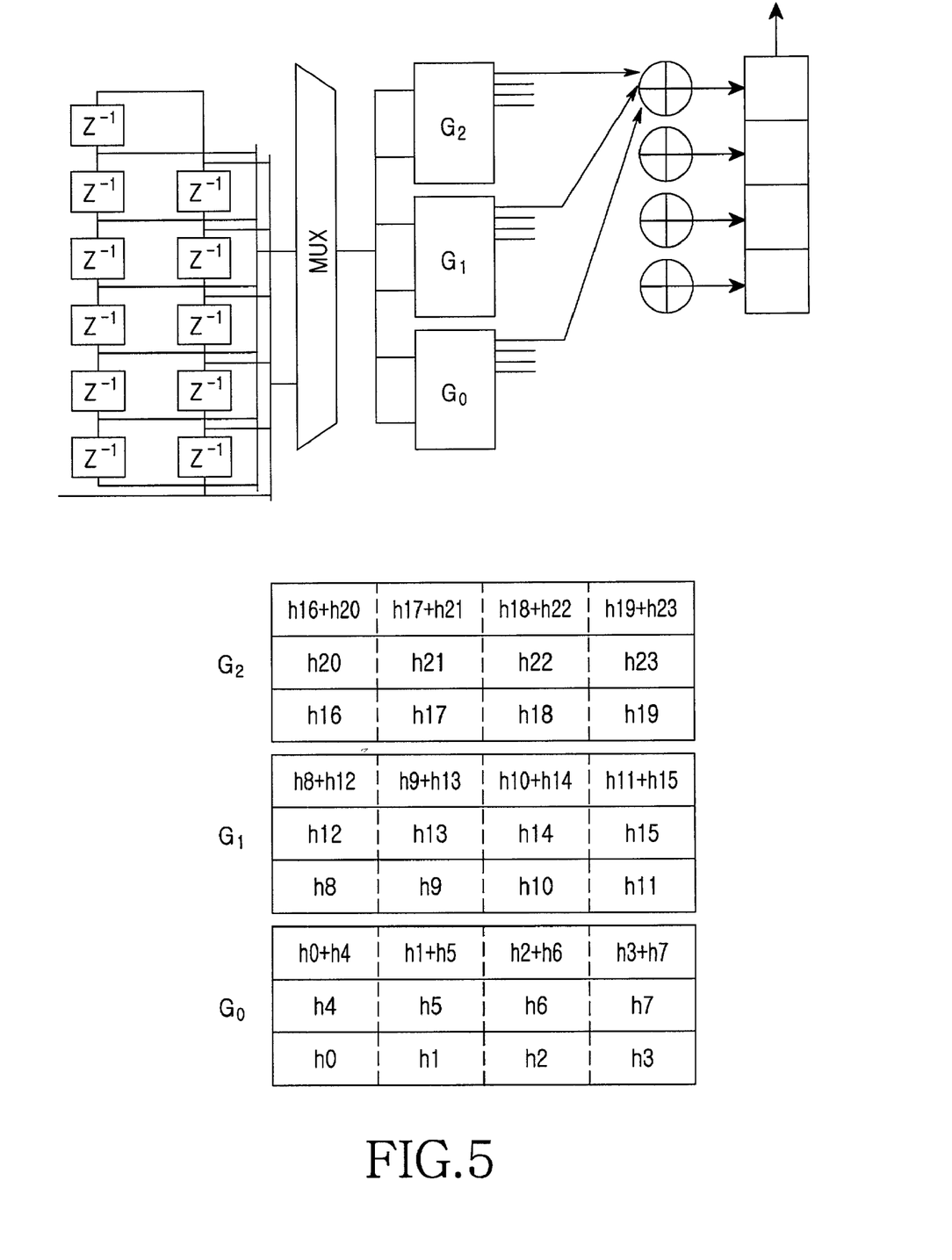
FIG. 5 diagrammatically shows a block interpolation filter in which an input of a subfilter, m, is 2, according to the interpolation filter structure of the present invention.
Figure 6:
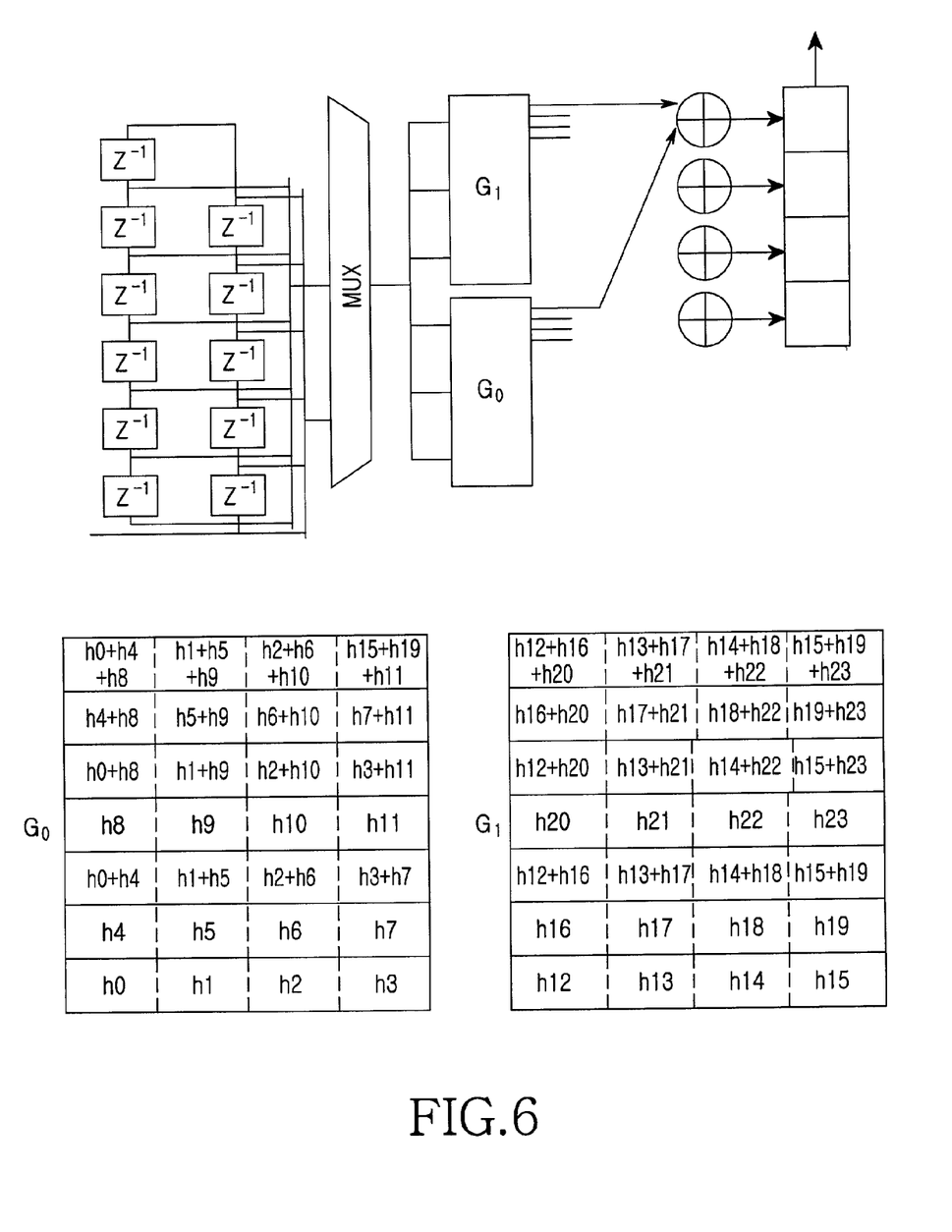
FIG. 6 diagrammatically shows a block interpolation filter in which an input of a subfilter, m, is 3, according to the interpolation filter structure of the present invention.
Figure 7:
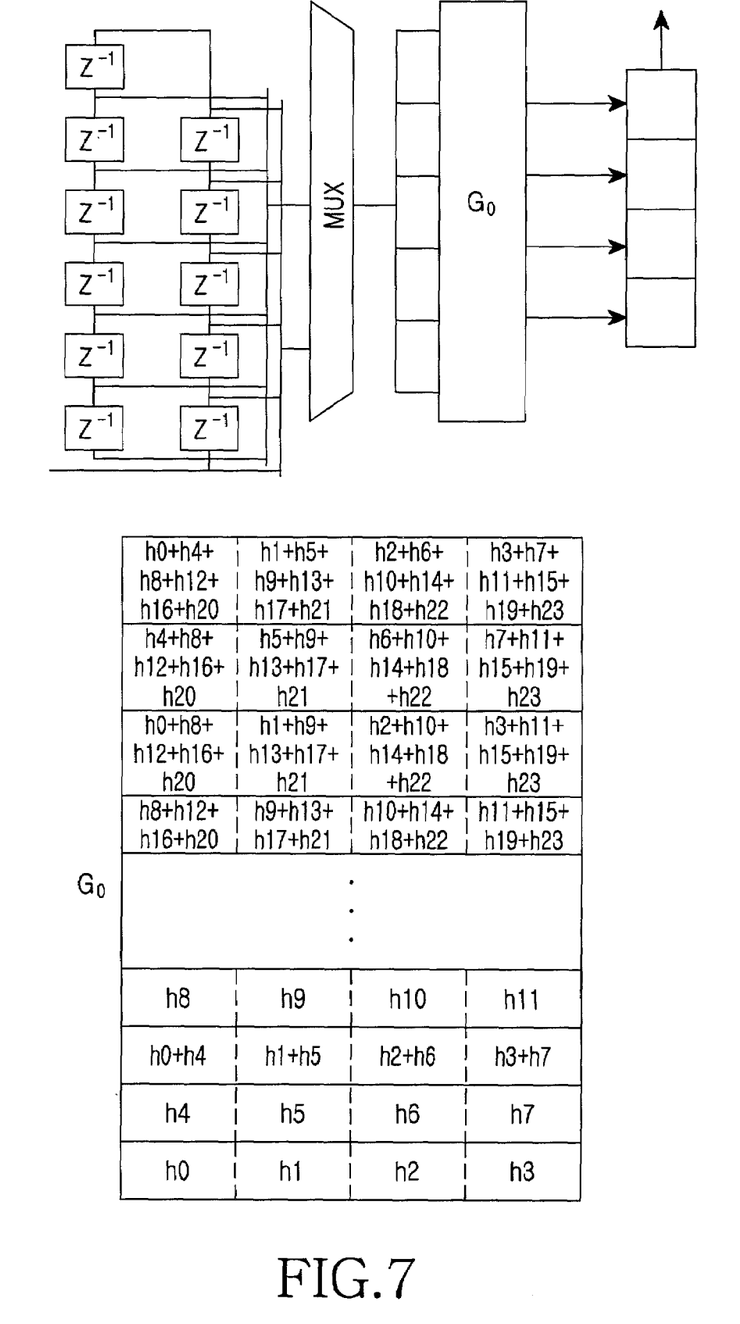
FIG. 7 diagrammatically shows a block interpolation filter in which an input of a subfilter, m, is 6, according to the interpolation filter structure of the present invention.

FIG. 4 shows an interpolation filter structure of the present invention, in which an input of a subfilter, m, is 1; FIG. 5 shows an interpolation filter structure of the present invention, in which an input of a subfilter, m, is 2; FIG. 6 shows an interpolation filter structure of the present invention, in which an input of a subfilter, m, is 3; and FIG. 7 shows an interpolation filter in which an input of a subfilter, m, is 6, wherein G indicates a newly organized group FIG. 4–7 indicate that the invention may be applied in cases where N≠l and/or M≠4. The LUT of FIG. 4 is obtained through modification-induction of the block structure aforementioned, and is composed of filter coefficients at the result of the binary input stream based filtering. In contrast, the input buffers depicted in FIG. 5 are grouped or paired, that is, the subfilters in FIG. 4 are paired off in FIG. 5, and the sum of each subfilter, due to increase in the newly organized group input, increases the LUT size and the memory demand of the subfilter. Similarly, as illustrated in FIGS. 6 and 7, the filters can be reconstructed, cutting off the addition operations in both cases. As shown in Table 2, the LUT size, memory space, and adder according to the suggested filter structure are expressed in terms of the number of filter taps, N, the interpolation rate, M, and the width of the subfilter, m, for a fully LUT based on the direct form and a half LUT due to the shared LUT, respectively. Therefore, the LUT size, or the number of entries, increases proportionally to 2 m, and the number of the subfilters. The memory space demand, on the other hand, increases proportional to the LUT size, the output word size, and the block size. And, the adder is a multiplication of the number of the subfilters and the block size. Such generalization consequently enables selection of an optimal filter in terms of LUT size, memory usage, and calculation.

TABLE 2

| | LUT Size | Memory Space | Adder |
|---|---|---|---|
| Fully LUT | (2m − 1)(N/Mm) | (2m − 1)(N/m)W | (N/mM − 1)M |
| Half LUT | (2m − 1)(N/2Mm) | (2m − 1)(N/2m)W | (N/2mM − 1)M |

A basic interpolation filter first interpolates an input sample as 0 using the up-sampler, and filters it off, and outputs the sample as much as the interpolation rate. Besides, the LUT filter conducts the indexing on the input stream to output the pre-saved filtering result. In the case of the interpolation filter of a modem sending end, the filtering operation is performed on the binary input. This is how the direct form suggested by the first embodiment of the present invention has the N/M subfilters, given that the entire filter coefficient is N and the interpolation is M. Also, the input buffer is composed of a transitional buffer for buffering the N/M samples. Every time a sample is inputted, the oldest sample of the buffer is discarded, and the sample in the buffer functions as a switch for outputting each LUT value. The filter output of the subfilter of the LUT with the block structure has the equivalent value to the filter coefficient. In addition, the interpolation enables output of M samples for one sample input. In this way, the M samples of each filter output are added together and the sum thereof is output. Such parallel processed value is than converted to one filter output, or a serial format, and comprises the filter output. In the shared LUT structure having the half memory demand of the direct form, since each pair of the N/M filters has the equivalent value to those of the direct form, the input buffer is divided into 2 groups, and the filtering process is performed by turns on one sample input into the N/2M subfilters through the multiplexer. That is to say, the result is obtained by accessing the LUT, a subfilter for one sample input, two times. However, such structure includes the addition operation in the LUT by grouping the subfilters. This consequently determines the value of m, an input of the subfilter according to the number of groups corresponding to a divisor of the number of subfilters. Further, the LUT size, the memory usage, and the adder are accordingly determined thereby. In other words, by adding the bit string of the input buffer that is divided into two groups to m, the input of the subfilter, the filter output value is outputted through the indexing within the LUT.

Next, as shown in Table 3, the functions of the well-known traversal structure, one of the most general structures in the past, the functions of the polyphase structure, the functions of the polyphase II structure and the three embodiments of the invention shown in FIGS. 4–4 are compared to one another. (It is noted that the polyphase structure (polyphase I) is described in "Proc. Intl. Symp. Circuit Sys., Vol. 2, 1998, pp. 316–319, and an improved polyphase structure' (polyphase II) is described in Electronic Letters, Vol. 35, Issue 18, pp. 1504–05, September '99). For the comparison, the 48-tap 1:4 interpolation filter used in a CDMA2000 (Spreading Rate 1) is implemented.

TABLE 3

| Architecture | LUT size | Memory size | Adder | Filtering clock |
|---|---|---|---|---|
| Transversal | 48 | 96W | 12 | 4B |
| Polyphase | 128 | 128W | 12 | B |
| Polyphase | 64 | 64W | 6 | 2B |
| Proposed m = 1 | 6 | 24W | 20 | 2B |
| Proposed m = 2 | 9 | 48W | 8 | 2B |
| Proposed m = 3 | 14 | 64W | 4 | 2B |

From the experiment, when the subfilter's input, m, is proposed as 1 (as shown in FIG. 4), the transversal filter structure exhibited 87.5% decrease in the LUT size, and 75.0% decrease in the memory space demand; the polyphase I exhibited 95.3% decrease in LUT size and 81.3% decrease in memory space demand; and the polyphase II showed 90.6%, and 81.3% decreases, respectively. However, the adders were increased up to 20, which is almost 3.3 times the original number of adders compared to the polyphase II.

On the other hand, when the subfilter's input, m, is proposed as 2 (as shown in FIG. 5), the polyphase II, one of the most effective structures among other traditional ones, showed 85.9% decrease in the LUT size, 25% of decrease in the memory space demand.

Thus, the polyphase II turned out to be very effective when m is proposed as 3 (as shown in FIG. 6), in which both the LUT size and the adders under the equivalent memory space demand were decreased. Moreover, when the proposed m is 2, the decreases in the LUT size and in the memory space demand are relatively predominant, compared with the adders increased by 2, so it also proved to be a very effective structure.

While the invention has been described in conjunction with various embodiments, they are illustrative only. Accordingly, many alternative, modifications and variations will be apparent to persons skilled in the art in light of the foregoing detailed description. The foregoing description is intended to embrace all such alternatives and variations falling with the spirit and broad scope of the appended claims.

What is claimed is:

1. An N-tap block interpolation filter with an interpolation rate M, comprising:

an N/M sized input buffer;

N/M look up table (LUT) subfilters having a filter coefficient equal to the interpolation rate M for outputting a pre-saved filtering result by conducting an indexing on an input stream wherein M is a non-zero integer and N is an integer multiple of M;

M adders for vector addition of each filtering result output by the subfilters; and M parallel-serial buffers for buffering each result from the M adders.

2. The N-tap block interpolation filter according to claim 1, wherein the input buffer is a transitional buffer for buffering N/M samples.

3. An N-tap block interpolation filter with an interpolation rate M, comprising:

an N/M sized input buffer;

a 2×1 multiplexer for multiplexing outputs from the input buffer;

N/2M look up table (LUT) subfilters having a filter coefficient equal to the interpolation rate M for outputting a pre-saved filtering result by conducting an indexing on an input stream wherein M is a non-zero integer and N is an integer multiple of 2M;

M adders for vector addition of each filtering result output by the subfilters; and M parallel-serial buffers for buffering each result from the M adders.

4. The N-tap block interpolation filter according to claim 3, wherein the filtering result is outputted by accessing N/2M LUT subfilters two times per sample input from the input buffer through the multiplexer.

5. An N-tap block interpolation filter with an interpolation rate M, comprising:

an N/M sized input buffer;

a 2×1 multiplexer for multiplexing outputs from the input buffer;

at least one pair of LUT subfilters for receiving m inputs from the multiplexer, for conducting an indexing over an input stream wherein M is a non-zero integer, N is an integer multiple of M and m is an integer, and for outputting a filtering result that includes a pre-saved addition operation;

M adders for vector addition of each filtering result output by the subfilters; and M parallel-serial buffers for buffering each result from the M adders.

* * * * *